US012021507B2

(12) United States Patent
Safavi-Naeini et al.

(10) Patent No.: US 12,021,507 B2
(45) Date of Patent: Jun. 25, 2024

(54) QUANTUM ACOUSTIC PROCESSOR

(71) Applicant: The Board of Trustees of the Leland Stanford Junior University, Stanford, CA (US)

(72) Inventors: Amir H. Safavi-Naeini, Palo Alto, CA (US); Marek Pechal, Zurich (CH); Patricio Arrangoiz-Arriola, Clarksville, MD (US); Edward Alexander Wollack, Clarksville, MD (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 930 days.

(21) Appl. No.: 16/551,004

(22) Filed: Aug. 26, 2019

(65) Prior Publication Data

US 2021/0281241 A1    Sep. 9, 2021

Related U.S. Application Data

(60) Provisional application No. 62/722,596, filed on Aug. 24, 2018.

(51) Int. Cl.
G06N 10/40 (2022.01)
G06N 10/00 (2022.01)
H03H 9/24 (2006.01)

(52) U.S. Cl.
CPC ............... *H03H 9/24* (2013.01); *G06N 10/00* (2019.01); *G06N 10/40* (2022.01)

(58) Field of Classification Search
CPC .......... G06N 10/00; G06N 10/40; H03H 9/24; H03H 9/02559; H03H 9/171; H03H 9/17
See application file for complete search history.

(56) References Cited

U.S. PATENT DOCUMENTS

2020/0028062 A1 * 1/2020 Rosen .................... G06N 20/10

FOREIGN PATENT DOCUMENTS

WO    WO2018/160674    11/2018

OTHER PUBLICATIONS

Arrangoiz-Arriola et al. ("Engineering Interactions Between Superconducting Qubits and Phononic Nanostructures", Physical Review A 94, 063864, 2016, pp. 1-8) (Year: 2016).*

(Continued)

*Primary Examiner* — Li Wu Chang
(74) *Attorney, Agent, or Firm* — LUMEN PATENT FIRM

(57) ABSTRACT

A coupled storage qubit nanomechanical resonator in a processing qubit superconducting circuit is provided that includes a phononic crystal resonator (PCR) film disposed on a substrate, where the PCR film includes a defect mode in a bandgap of the PCR film where a storage qubit is encoded, a pair of electrodes generate voltages within the PCR film, where the defect is dimensioned to support a unique electrical potential generated by a local mechanical phonon mode of the PCR film, where a unique resonance frequency that is dependent on the defect dimensions is output from the PCR film, a coupling capacitor that is coupled to the PCR film, where the coupling capacitor is disposed to receive the output unique resonance frequency, and a processing qubit, where the processing qubit is capacitively coupled to the PCR film by the coupling capacitor, where the storage qubits are connected to the processing qubits.

10 Claims, 6 Drawing Sheets

(56) References Cited

OTHER PUBLICATIONS

Chu et al. ("Climbing the phonon Fock state ladder", https://arxiv.org/pdf/1804.07426v1.pdf, arXiv:1804.07426v1 [quant-ph] Apr. 20, 2018, pp. 1-28) (Year: 2018).*
Chang et al. ("Slowing and stopping light using an optomechanical crystal array", New J. Phys. 13, 2011, pp. 1-26) (Year: 2011).*
Naik et al. ("Random access quantum information processors using multimode circuit quantum electrodynamics", Nature Communications, 8:1904, 2017) (Year: 2017).*
Chou et al. ("Deterministic teleportation of a quantum gate between two logical qubits", https://arxiv.org/abs/1801.05283, arXiv:1801.05283v1 [quant-ph] Jan. 16, 2018, pp. 1-33) (Year: 2018).*
Random access quantum information processors using multimode circuit quantum electrodynamics, Nature CommunicationsI8:1904 IDOI: 10.1038/s41467-017-02046-61.
Coupling a Superconducting Quantum Circuit to a Phononic Crystal Defect Cavity, American Physical Society, 2160-3308=18=8(3)= 031007(10).
Engineering interactions between superconducting qubits and phononic nanostructures, Physical Review A 94, 063864 (2016).

* cited by examiner

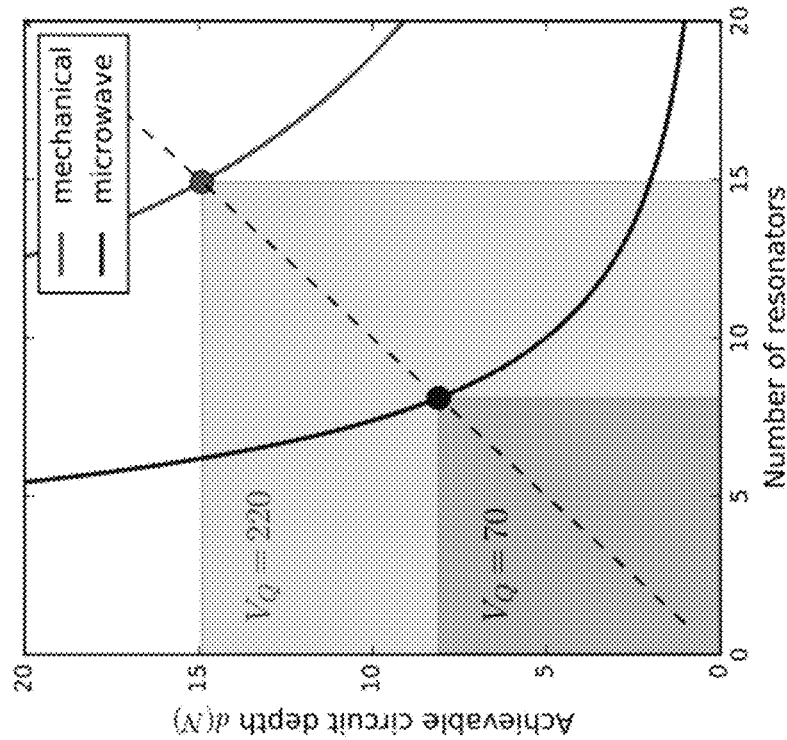
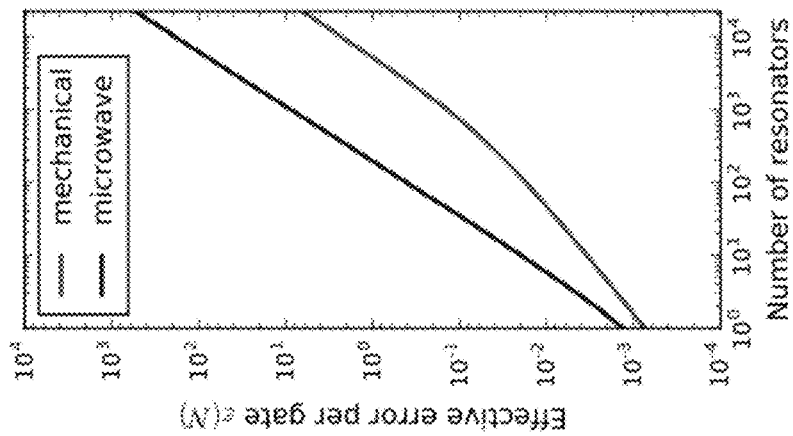
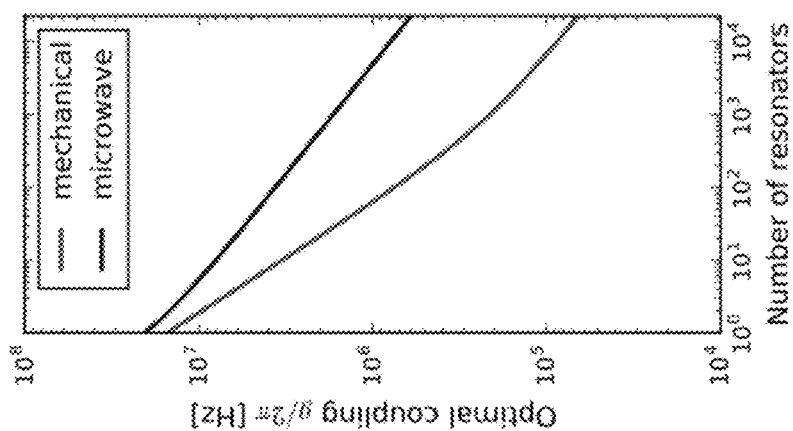
FIG. 2A
FIG. 2B
FIG. 2C

QUANTUM ACOUSTIC PROCESSOR

CROSS-REFERENCE TO RELATED APPLICATIONS

This application claims priority from U.S. Provisional Patent Application 62/722,596 filed Aug. 24, 2018, which is incorporated herein by reference.

STATEMENT OF GOVERNMENT SPONSORED SUPPORT

This invention was made with Government support under contract N00014-15-1-2761 awarded by the Office of Naval Research, and under contract 1708734 awarded by the National Science Foundation. The Government has certain rights in the invention.

FIELD OF THE INVENTION

The invention relates to superconducting circuits. More specifically, the invention relates to a coupled nanomechanical resonator in a superconducting circuit.

BACKGROUND OF THE INVENTION

Superconducting circuits are one of the architectures currently used to build the first coherent quantum devices with tens of quantum bits, complex enough to preclude their efficient classical simulation. This exciting crossover to the regime where quantum devices may offer advantages in physical simulations or information processing over classical computers, was enabled by rapid technological progress in the past decade, aimed mainly at the development of quantum gates with higher fidelities and qubits with longer coherence times.

The prevailing approach to quantum computing with superconducting circuits is to use qubits as both data storage and processing units and to control each qubit individually. The second point, in particular, complicates scaling to large devices—as the number of qubits grows, the amount of cabling and electronic equipment needed makes individual control of qubits challenging. Alternative approaches have emerged where instead of using the nonlinear element as a qubit, it is used as a processing element to control states in the larger Hilbert space of one or several electromagnetic oscillators by application of more complex control signals. In one approach, a system composed of a transmon qubit coupled to N=11 on-chip linear electromagnetic resonators is used effectively as an N-qubit system. Although the use of only a single or a small number of processing qubits presents a bottleneck in the computation and makes the process less parallelizable, control signals only need to be sent to the processing qubits, potentially saving a significant amount of resources. Such architectures are appealing since they can effectively amplify the quantum computational capacity of a physical setup.

Two-qubit gates are executed in series via the processing qubit in this architecture. Computation run times are therefore expected to be generally longer, and it is essential that the storage elements have very long coherence times to avoid excess loss in fidelity. When using microwave systems for storage, one can either use on-chip resonators (or qubits) or machined "three-dimensional" cavities. On-chip resonators are usually compact but have coherence times on the same order as qubits, while 3d cavities can have orders of magnitude higher quality factors but are challenging to scale due to incompatibility with microprocessing technologies.

What is needed is an architecture in which on-chip mechanical resonators serve as both very compact and long-lived quantum storage.

SUMMARY OF THE INVENTION

To address the needs in the art, a coupled storage qubit nanomechanical resonator in a processing qubit superconducting circuit is provided that includes a phononic crystal resonator film disposed on a substrate, where the phononic crystal resonator film includes a defect mode in a bandgap of the phononic crystal resonator film where a storage qubit is encoded, a pair of electrodes disposed to generate voltages within the phononic crystal resonator film, where the defect is dimensioned to support a unique electrical potential generated by a local mechanical phonon mode of the phononic crystal resonator film, where a unique resonance frequency that is dependent on the defect dimensions is output from the phononic crystal resonator film, a coupling capacitor that is coupled to the phononic crystal resonator film, where the coupling capacitor is disposed to receive the output unique resonance frequency, and a processing qubit, where the processing qubit is capacitively coupled to the phononic crystal resonator film by the coupling capacitor, where the storage qubits are connected to the processing qubits.

According to one aspect of the invention, the phononic crystal resonator film is a one-dimensional or a two-dimensional piezoelectric crystal resonator film.

In a further aspect of the invention, the qubit is disposed on the substrate, or disposed on a separate substrate.

In yet another aspect of the invention, the phononic crystal resonator film includes an array of the phononic crystal resonator films. In one aspect the phononic crystal resonator film array is coupled to a single the qubit, or a plurality of the superconducting circuits. In another aspect, the multiple phononic crystal resonator films in the array connected to one the qubit are separated in frequency space according to unique dimensions of the defect space in each the phononic crystal resonator film.

According to one aspect of the invention, the phononic crystal resonator film includes a piezoelectric crystal resonator film, where the piezoelectric crystal resonator film is a material that includes lithium niobate, lithium tantalate, barium titanate, aluminum nitride, gallium arsenide, gallium nitride, gallium phosphide, or indium phosphide.

In another aspect of the invention, the substrate is a material that includes silicon, or sapphire.

In a further aspect of the invention, the coupled nanomechanical resonator in a superconducting circuit is configured for gate execution. In one aspect, the gate is between the local mechanical phonon mode.

According to another aspect of the invention, the piezoelectric crystal resonator film is incorporated to a circuit configuration that includes a processing Josephson-junction-based qubit, a fluxonium circuit, a transmon qubit, a (Superconducting Nonlinear Asymmetric Inductive eLements) SNAIL qubit, a quantum circuit acting on N the mechanical modes acting as storage qubits, a circuit where any two-qubit gates between distinct pairs of the storage qubits are performed simultaneously, or a quantum circuit acting on N the storage qubits operated sequentially, where a single the processing qubit mediates interactions between N the storage qubits on a piezoelectric crystal resonator film, where multiple the processing qubits control groups of the storage qubits and multiple the processing qubits are connected to one another, where multi-storage-qubit gates are performed simultaneously by driving the processing qubit. In one aspect, the nanomechanical devices are fabricated on a separate chip, where a flip-chip bond is disposed to connect the processing qubit to the phononic crystal resonator film, where coupling between the phononic crystal resonator and the storage qubit includes via-coupling, or parametric coupling, where the qubits comprise a storage mode encoding comprising a discrete variable encoding or a continuous variable encoding. In another aspect, each effective two-resonator gate includes two qubit-resonator swap gates surrounding one arbitrary qubit-resonator gate.

According to another aspect of the invention, the coupled nanomechanical resonator in a superconducting circuit.

BRIEF DESCRIPTION OF THE DRAWINGS

FIGS. 2A-2C show (1A) Dependence of the optimal coupling which minimizes the effective gate error on the number of resonators N. (1B) The effective error probability per gate achieved at the optimal coupling from (1A) as a function of N. (1C) Illustration of the quantum volume in the electromechanical and purely microwave implementation in a plot of the achievable circuit depth d(N) as a function of N. Since d(N) decreases with increasing N, the quantity min(N, d(N)) is maximized when N=d(N), as shown by the points indicating the intersection of the curves with the dashed diagonal line. The quantum volume is then the area of the filled squares, according to the current invention.

DETAILED DESCRIPTION

A coupled storage qubit nanomechanical resonator in a processing qubit superconducting circuit is provided that includes a phononic crystal resonator film disposed on a substrate, where the phononic crystal resonator includes a defect mode in a bandgap of the phononic crystal resonator where a storage qubit is encoded. A pair of electrodes are disposed to generate voltages within the phononic crystal resonator film, where the defect is dimensioned to support a unique electrical potential generated by a local mechanical phonon mode of the phononic crystal resonator. A unique resonance frequency that is dependent on the defect dimensions is output from the phononic crystal resonator film to a coupling capacitor that is coupled to the phononic crystal resonator film and is disposed to receive the output unique resonance frequency. Finally, processing qubit is capacitively coupled to the phononic crystal resonator film by the coupling capacitor, where the storage qubits are connected to the processing qubits.

According to one embodiment, the current invention includes micrometer-sized phononic crystal resonators having quality factors that exceed $10^{10}$. The use of phononic bandgap structures leads to robust high-Q mechanical resonances. Moreover, phononic bandgaps isolate the qubit from phonon leakage channels that are likely to become problematic on highly piezoelectric substrates such as those needed to obtain large coupling rates. Crucially, the small size of the resonators means that a substantial number of them can be fabricated in a space comparable with the size of a single qubit and directly coupled to it. To make the resonators individually addressable by the qubit, they can be fabricated with sufficiently separated frequencies which are determined by the designed geometry of the phononic crystal sites.

In further embodiments of the invention, the phononic crystal resonator film includes an array of the phononic crystal resonator films. In one aspect the phononic crystal resonator film array is coupled to a single the qubit, or a plurality of the superconducting circuits. In another aspect, the multiple phononic crystal resonator films in the array connected to one the qubit are separated in frequency space according to unique dimensions of the defect space in each the phononic crystal resonator film.

In the circuit picture of quantum computation, the algorithm is typically decomposed into a series of two-qubit and single-qubit gates. It is assumed here that the single-qubit operations are lumped into the two-qubit ones. Gates which operate on distinct pairs of qubits are assumed to be performed simultaneously in a single discrete time step. The number of such steps required to complete the computation is called the circuit depth. An example of a single step in a circuit with N qubits is shown schematically in FIG. 1A. There can be up to N/2 two-qubit gates performed simultaneously between arbitrarily chosen pairs of qubits.

Figures 1A, 1B, 1C:
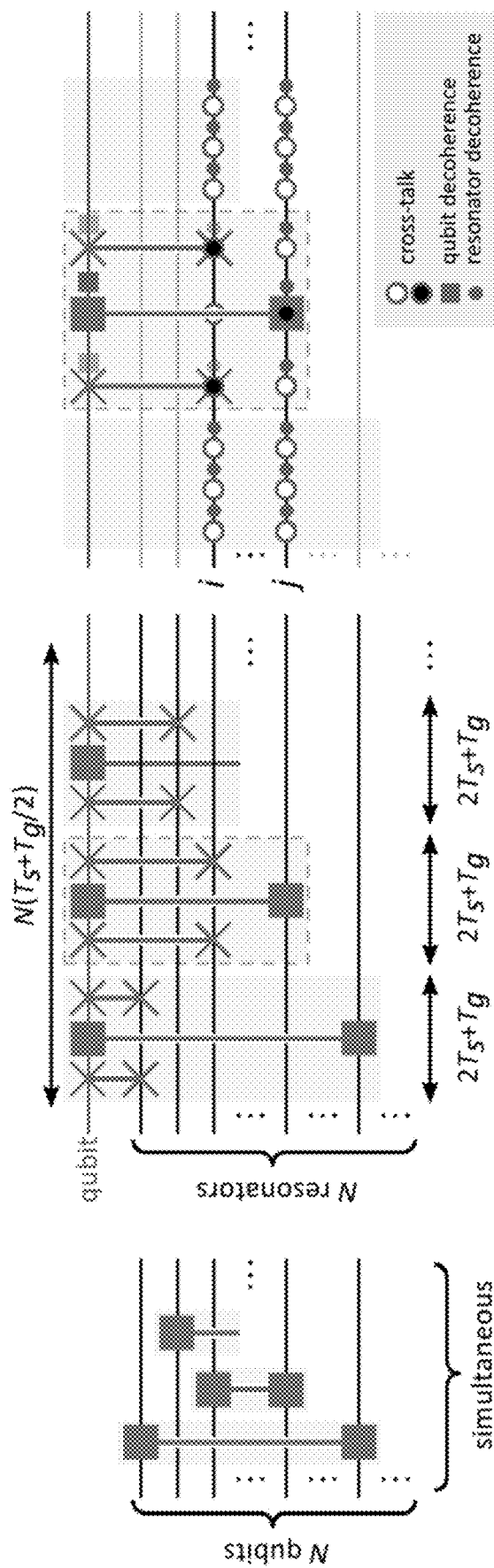
FIGS. 1A-1C show (1A) a schematic representation of one step of a quantum circuit acting on N qubits. All two-qubit gates between distinct pairs of qubits are performed simultaneously. (1B) Sequential version of the circuit from (1A), with the single qubit mediating interactions between N resonators. Each effective two-resonator gate comprises two qubit-resonator swap gates surrounding one arbitrary qubit-resonator gate. (1C) The errors acting on a specific pair of resonators i and j in the sequential protocol. Decoherence errors are shown by solid circles (for the resonators) and squares (for the qubit). Cross-talk errors which occur because the gates acting on i and j also weakly address other resonators are shown by filled red circles. The other class of cross-talk errors, caused by gates performed on other resonators affecting i and j, is indicated by empty red circles, according to the current invention.

In the architecture described here, the qubit states are stored in the resonators as superpositions of the vacuum state $|0\rangle$ and the single-photon Fock state $|1\rangle$. The gates, designed in such a way that the resonators do not leave this two-dimensional subspace, need to be performed sequentially via the single processing qubit. The sequential equivalent of the circuit from FIG. 1A is illustrated in FIG. 1B. A simple way to realize a gate between resonators i and j is to perform a swap operation between the qubit and resonator i, followed by an entangling gate between the qubit and resonator j and another swap with i. Assuming that the swap operation takes a time $T_s$ and the entangling gate on average $T_g$, the effective gate between the resonators takes $2\,T_s + T_g$ and the whole step of the quantum circuit $N(T_s + T_g/2)$. For simplicity, the entangling gate is considered to be a phase gate implemented as a $2\pi$ rotation swapping the resonator excitation into the qubit and back while accumulating an overall 1 phase factor. In this special case, we have $T_g = 2\,T_s$.

Focusing now on the evolution of one specific pair of resonators over the time period $N(T_s + T_g/2)$ and approximate it as an ideal two-qubit gate combined with an "error" acting on each of the resonators, occurring with some probability s which is estimated herein. To this end, some crude approximations are used, but it is believed this does not greatly affect the main goal which is to observe how the performance of the system depends on the lifetimes of its components and how it scales with the number of resonators. For instance, the precise nature of the errors (dephasing, relaxation, etc.) are not specified and they are characterized by a single "error probability". It is also assumed that the error probabilities can be simply added together.

The evolution of two of the resonators, i and j, is schematically illustrated in FIG. 1C. The relevant error contributions, which are indicated by the empty and solid circle symbols, are due to the limited selectivity of the operations (cross-talk, which leads to some small amount of entanglement with resonators other than i and j or to excitation of the resonators to higher energy levels), and decoherence of the resonators and the qubit. As will be shown, both types of errors present a tradeoff between the number of resonators in the system and its performance. With increasing number of resonators, the time required for a single layer of the quantum circuit grows and the probability of a decoherence error goes up. At the same time, a larger number of resonators means a smaller detuning between them, leading to larger cross-talk errors.

To estimate the contribution to the error due to decoherence, it is noted that the quantum information stored in the resonator that is swapped with the qubit spends roughly a time $T_s/2 + T_g + T_s/2 = 3\,T_s$ in the qubit out of the total time $N(T_s + T_g/2) = 2NT_s$. The corresponding error probability is therefore approximately $((2N-3)\Gamma r + 3q)\,T_s$. The other resonator experiences the error rate r for the whole period $2NT_s$. In total, the decoherence error probability per qubit is $$\varepsilon_{dec} = \left(\left(2N - \frac{3}{2}\right)\Gamma_r + \frac{3}{2}\Gamma_q\right)T_s \approx (2N\Gamma_r + 3\Gamma_q/2)T_s.$$

Here it is assumed $N \gg 1$ to simplify the expression. To estimate the cross-talk error, it is noted that the ideal qubit-resonator gates considered above are resonant processes that are rotations in the subspace spanned by $|g1\rangle$ and $|e0\rangle$. The rate of this rotation is 2 g, where g is the effective coupling strength between the qubit and the resonator. Assuming that the resonators are spaced uniformly in frequency space with a nearest-neighbor detuning and that they have the same coupling g to the qubit, each of the gates drives unwanted transitions detuned by $\delta k = \pm\delta, \pm 2\delta, \ldots$. In the limit of small $g/\delta$, the probability of these unwanted transitions is estimated as $\Sigma_k g^2/\delta_k^2 \propto g^2/\delta^2$. Numerical simulations indicate that this is a rather pessimistic estimate and by modulating the coupling g smoothly in time, the cross-talk can be made significantly smaller. Being conservative in this analysis, it is assumed that the combined cross-talk error probability for the effective resonator-resonator gate, illustrated in FIG. 1C by the filled circles, is $g^2/\delta^2$.

Cross-talk from gates between other pairs of resonators affects resonators i and j, even if i and j are idle. This is shown schematically in FIG. 1C by the empty circles. One may expect a gate acting on a resonator detuned by k to induce an error with a probability at most about $g^2/\delta_k^2$. If this expression is summed over all the resonators a total is obtained which again scales as $g^2/\delta^2$. Once more, this is close to the worst-case estimate, and it is expected to find a much more favorable dependence on $g/\delta$ by designing the coupling pulses with care.

Conservatively, all the cross-talk errors add up to an amount on the order of $g^2/\delta^2$. Importantly, this error probability does not explicitly scale with N. To keep this derivation brief, the potential constant pre-factor is not discussed here. This will be denoted by A and assume it is on the order of unity. Later it will be shown that the performance of the system depends only quite weakly on its exact value.

The storage resonators frequencies are considered to be uniformly distributed over the band gap of the phononic crystal. In silicon, gaps with frequency spans greater than half of their center frequency $\omega_0$ have been demonstrated. The nearest-neighbor detuning between the resonators is then $\omega_0/2N$. For numerical calculations, it is assumed that $\omega_0/2 = 4$ GHz which is compatible with typical superconducting qubit frequencies.

Since it is assumed that the qubit used in this system is a transmon—a weakly anharmonic circuit—the presence of the transitions to its higher excited states also need to be taken into account. To first approximation, only one spurious transition from the first to the second excited state is considered, which is detuned by $\alpha$ from the qubit's fundamental transition. With an appropriate choice of $\alpha$, one can ensure that whenever the qubit is effectively resonant with one of the resonators, the spurious transition frequency lies half-way between resonator frequencies and so is off-resonant by $\omega_0/4N$. Therefore it is set equal to this smallest detuning encountered in the system.

Adding the cross-talk $Ag^2/\delta^2 = 16AN^2g^2/\omega_0^2$ and the decoherence contribution $\varepsilon_{dec}$ together, the over-all error probability is obtained $\varepsilon$ per qubit for a single step of the quantum circuit. It is further noted that the swap time $T_s$ is related to the coupling rate g by $T_s = \pi/2\,g$. The error probability $\varepsilon$ can now be written in a way that explicitly spells out its dependence on the number of resonators N and on the coupling g:

$$\varepsilon(N) = \frac{\pi(N\Gamma_r + 3\Gamma_q/4)}{g} + \frac{16AN^2g^2}{\omega_0^2}. \quad (1)$$

As will be seen below, due to the trade-off between the cross-talk and decoherence contributions, for a given set of decoherence parameters and number of resonators N, the error probability per qubit ε is minimized for an optimal value of the coupling rate g.

Turning now to the quantum volume estimates, the expected performance of the proposed electromechanical architecture is qualified in terms of the quantum volume and show a favorable comparison with analogous systems using microwave resonators for storage. The quantum volume is a recently introduced figure of merit for quantum hardware, which captures the number of qubits in a system as well as the number of gates which can be performed with it, representing the intuitive notion that "interesting" algorithms require both. If a system of a given type with N qubits can implement "typical" quantum circuits with maximum depth d(N) before the error exceeds some fixed threshold, the quantum volume $V_Q$ is defined as $$V_Q = \max N [\min(N, d(N))]^2 \qquad (2)$$

The maximum depth d(N) can be estimated as 1/N ε(N), where ε(N) is the error probability per qubit in one step of the quantum circuit. This probability depends in a non-trivial way on the number of qubits due to various technical issues such as cross-talk, frequency crowding, etc. It is also strongly dependent on the topology of the system. For example, if the system has all-to-all connectivity between qubits then all two-qubit gates have in principle the same complexity. At the other extreme, if only nearest-neighbor couplings are available in a 1d chain of qubits then a typical two-qubit gate needs to be mediated on average by N/3 qubits and may therefore be expected to fail with a probability which grows linearly with N.

In the system of the current invention, the error probability is estimated by Eq. (1). For any given N and decoherence rates q and r, g is chosen to minimize this expression. The minimum is attained for $$g = \left( \frac{\pi(N\Gamma_r + 3\Gamma_q/4)\omega_0^2}{32AN^2} \right)^{1/3} \qquad (3)$$

and takes the value $$\varepsilon(N) \approx 3 \left( \frac{4A\pi^2 N^2 (N\Gamma_r + 3\Gamma_q/4)^2}{\omega_0^2} \right)^{1/3}. \qquad (4)$$

Evaluating the optimal coupling rate g from Eq. (3) as a function of the number of storage modes N numerically for $\omega_0/2\pi=4$ GHz, Γq=1/(50 μs) and A=1, provides the plot shown in FIG. 2A. For the mechanical resonator case, by a realistic estimate of the mechanical quality factor $Q_{mech}=\omega_0/\Gamma r=10^9$ is used while for the microwave case, the quality factor of the resonators is assumed to be comparable with that of the qubit, that is Γr≈Γq.

The fact that the optimal coupling can be reached in the electromechanical system is not obvious and is discussed in more detail below. The corresponding errors for both system, as given by Eq. (4) are plotted in FIG. 2B.

Using Eq. (2), the quantum volume can now be calculated. Since the achievable circuit depth d(N)=1/N ε(N) plotted in FIG. 2C is a decreasing function of N, the expression min(N, d(N)) increases as long as N<d(N), after which it starts to decrease. For simplicity, the requirement that N be integer is relaxed, which allows one to approximately find the maximum of min(N, d(N)) as the point where N=d(N). For the specific parameters used above, this is shown graphically in FIG. 2C. The quantum volume of the electromechanical system is maximized for approximately N=15 resonators and reaches a value $V_Q$=220. This is roughly three times higher than in the purely microwave on-chip system whose quantum volume reaches its maximum for about N=8 resonators.

More generally, the quantum volume can be estimated by solving the equation N=d(N) while assuming Γq»N Γr for the electromechanical system and Γq«$N_r$=Nq for the microwave one. This then provides $$V_Q = \begin{cases} \left( \dfrac{2Q_q}{9\pi\sqrt{3A}} \right)^{1/2} & \text{for the mechanical system,} \\ \left( \dfrac{Q_q}{6\pi\sqrt{3A}} \right)^{2/5} & \text{for the microwave system,} \end{cases}$$

for the microwave system, where $Q_q=\omega_0/\Gamma_q$ is the quality factor of the qubit, in this numerical estimate $Q_q=1.25\times10^6$. As alluded to before, it is observed that this result scales quite weakly with the dimensionless constant A which hides the details of the cross-talk error estimate.

It should be noted that the estimates above neglect two other potential sources of error: relaxation of the qubit due to piezoelectric coupling to phonons in the substrate and relaxation of the resonators due to off-resonant coupling to the qubit (Purcell decay). One can expect the first effect to be negligible as long as the qubit frequency is within the phononic band gap because in that case it is protected against phonon radiation in the same way as the mechanical resonators. Finite element simulations confirm this intuition and show that the limit on the qubit coherence time from mechanical relaxation is above 100 μs for realistic phononic crystal designs, though this remains to be experimentally demonstrated. A conservative estimate of the Purcell decay contribution to the error probability can be obtained by approximating the excess relaxation rate in the resonators as $\Delta\Gamma_r=\Gamma_q(g/\delta)^2=4\Gamma_q N^2 g^2/\omega_0^2$. The corresponding increase in the effective gate error is $\Delta\varepsilon=2\Delta\Gamma_r$ $NT_s=\pi\Delta\Gamma_r N/g$. This needs to be compared with the overall error probability. Using Eqs. (3) and (4), the following is provided $$\frac{\Delta\varepsilon}{\varepsilon} < \frac{2}{3} \left( \frac{\pi^2 N^5}{12 A^2 Q_q^2} \right)^{1/3}.$$

As shown above, the number of resonators maximizing the quantum volume is approximately $N=(2Q_q/9\pi\sqrt{3A})^{1/4}$ and therefore $$\frac{\Delta\varepsilon}{\varepsilon} < \frac{1}{9A} \left( \frac{8\pi\sqrt{A/3}}{3Q_q} \right)^{1/4} \ll 1.$$

This confirms that the Purcell decay effect is negligible for our purposes.

Figure 3A:
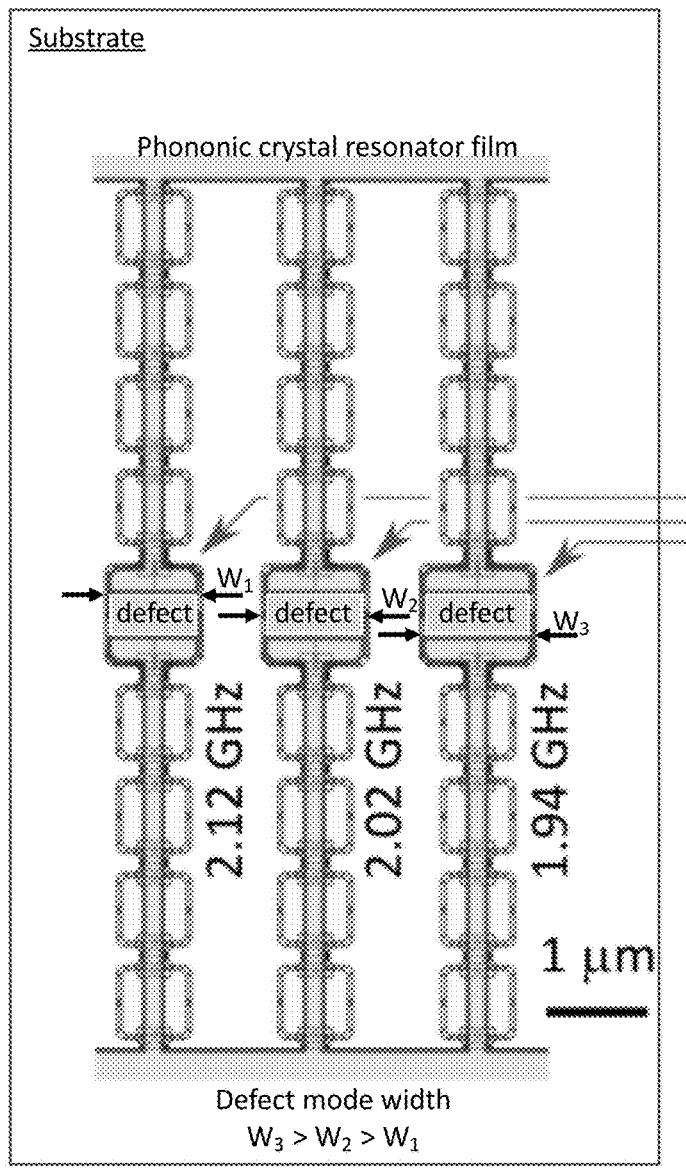
FIGS. 3A-3I show (3A) A drawing of several phononic crystal resonators and their coupling capacitors. The shading scheme in the central regions represent the electrical potential generated by the localized mechanical modes. The lithographically defined variation in the dimensions of the resonator cell leads to different resonant frequencies, all of which lie within the band gap (3B) of the surrounding phononic crystal. (3C) Diagram representing the superconducting circuit's capacitive coupling to a phononic cavity resonator via the capacitor $C_c$. This is effectively connected in parallel with the rest of the circuit's capacitance, adding up to a total of $C_\Sigma$. The inductive part of the circuit may include for example a single Josephson junction (3D), giving rise to a transmon qubit or a junction shunted by a nearly linear junction array (3E), resulting in a fluxonium circuit. In general, the remainder of the circuit is considered to be an arbitrary element (3F) whose energy is diagonal in the eigenbasis. (3G-3H) Show the qubit is disposed on the substrate, or disposed on a separate substrate, respectively. 3I) The qubit capacitance values $C_\Sigma$ for which the optimal coupling from Eq. (3) can be reached, as a function of the number of resonators N, are indicated by the green region. The corresponding charging energies $E_C = e^2/2C_\Sigma$ are shown on the right axis. The thick black lines represent lower bounds on $C_\Sigma$ while the thin ones are upper bounds. The thick solid line indicates $C_\Sigma = 40$ fF, an approximate value above which a qubit with a frequency $\omega_0/2\pi = 4$ GHz can be considered to be in the transmon regime. The thick dashed line shows the limit due to the capacitance of the couplers, assuming a value of $C_1 = 1$ fF per coupler. The thin solid line is an upper bound if the anharmonicity of the qubit is to be at least 50 MHz. The thin dashed line represents the condition for the anharmonicity to exceed half of the nearest-neighbor detuning between the resonators. The shaded area indicates points consistent with all the constraints above, according to the current invention.
Figure 3B:
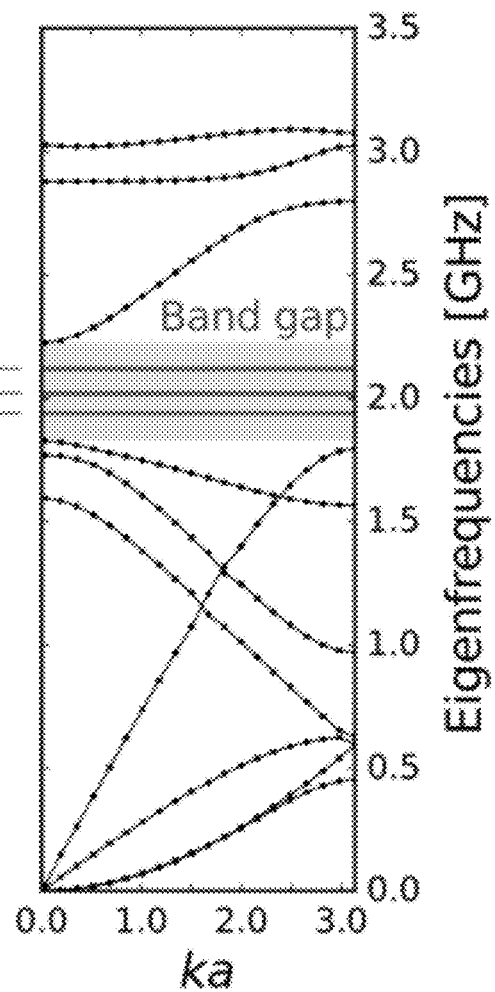
Figure 3C:
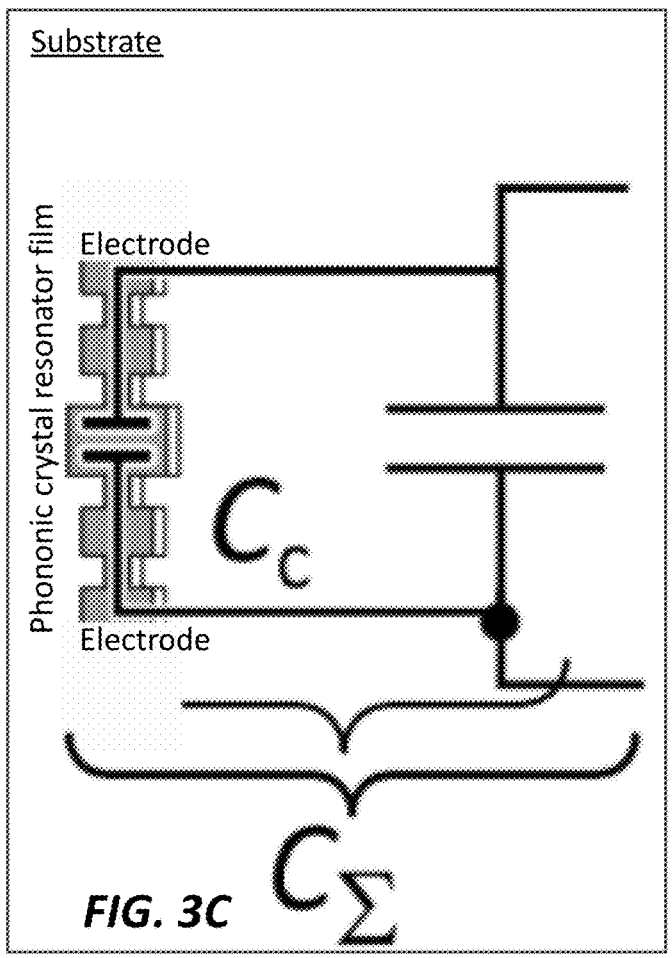
Figure 3D:
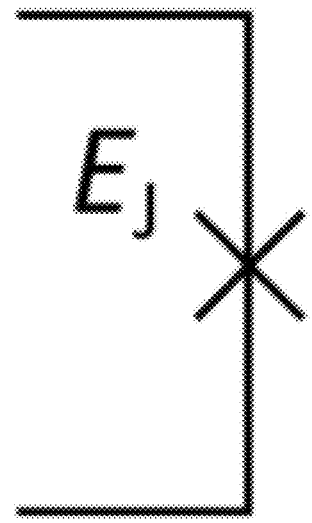
Figure 3E:
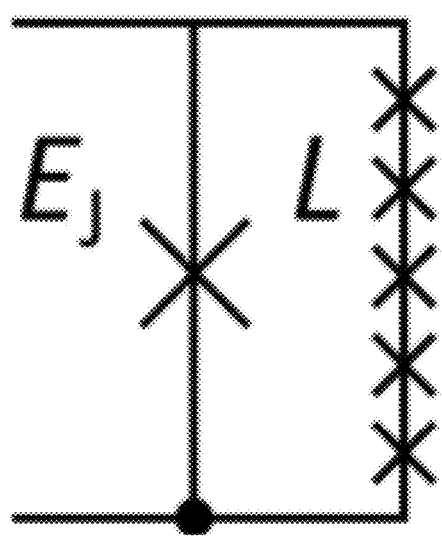
Figure 3F:
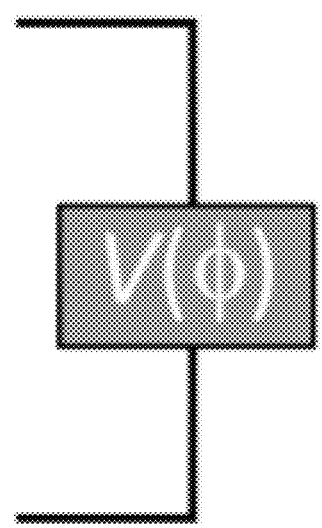

Turning now to the coupling of nanomechanical resonators to superconducting circuits. According to one aspect of the invention, the phononic crystal resonator film is a one-dimensional or a two-dimensional piezoelectric crystal resonator film. In an exemplary embodiment, each of the mechanical resonators are considered to be realized as a defect in the band gap of a one-dimensional phononic crystal, fabricated out of thin-film lithium niobate on silicon and coupled to two metal electrodes, as shown in FIG. 3A. Multiple resonators can be connected to the same qubit and separated in frequency space by choosing appropriate dimensions of the defect site in the phononic crystal. The resonance frequencies are chosen to lie within the gap in the crystal's band diagram plotted in FIG. 3B. The electric field induced by the voltage between the two electrodes couples to the motion of the resonator via the piezoelectric effect in the lithium niobate film. This coupling is bilinear in the voltage V and the effective displacement x of the resonator mode, described by a Hamiltonian of the form $\hat{H}_{int} \propto \hat{V}\hat{x}$. Writing the displacement in terms of the mode's ladder operators $\hat{a}$ and $\hat{a}^\dagger$, the Hamiltonian can be expressed as where $q_{\mathit{eff}}$ is a coupling parameter with a unit of charge. As part of the qubit's superconducting circuit, one can imagine the electrodes as a capacitor with a small capacitance $C_c$ connected in parallel with the rest of the circuit, as shown in FIGS. 3C-3F, giving rise to a total effective capacitance $C_\Sigma$. In this picture, only a single mechanical resonator is explicitly considered but it can be imagined that the remaining N−1, each connected to its own set of coupling electrodes, simply contribute to the total capacitance $C_\Sigma$. Only a single resonator is resonant with the qubit at any given time and the presence of the N−1 off-resonant ones does not change the following analysis. It should also be noted that since each resonator is suspended and only connected to the bulk of the chip by the phononic crystal with a wide band gap, there is for all practical purposes no direct phononic coupling between the resonators. This high degree of isolation is enabled by the wide phononic bandgap and the complete absence of phonon propagation in vacuum, something which does not have a parallel in microwave systems.

According to one aspect of the invention, the phononic crystal resonator film includes a piezoelectric crystal resonator film, where the piezoelectric crystal resonator film is a material that includes lithium niobate, lithium tantalate, barium titanate, aluminum nitride, gallium arsenide, gallium nitride, gallium phosphide, or indium phosphide. In another aspect of the invention, the substrate is a material that includes silicon, or sapphire.

According to another aspect of the invention, the piezoelectric crystal resonator film is incorporated to a circuit configuration that includes a processing Josephson-junction-based qubit, a fluxonium circuit, a transmon qubit, a (Superconducting Nonlinear Asymmetric Inductive eLements) SNAIL qubit, a quantum circuit acting on N the mechanical modes acting as storage qubits, a circuit where any two-qubit gates between distinct pairs of the storage qubits are performed simultaneously, or a quantum circuit acting on N the storage qubits operated sequentially, where a single the processing qubit mediates interactions between N the storage qubits on a piezoelectric crystal resonator film, where multiple the processing qubits control groups of the storage qubits and multiple the processing qubits are connected to one another, where multi-storage-qubit gates are performed simultaneously by driving the processing qubit. In one aspect, the nanomechanical devices are fabricated on a separate chip, where a flip-chip bond is disposed to connect the processing qubit to the phononic crystal resonator film, where coupling between the phononic crystal resonator and the storage qubit includes via-coupling, or parametric coupling, where the qubits comprise a storage mode encoding comprising a discrete variable encoding or a continuous variable encoding. In another aspect, each effective two-resonator gate includes two qubit-resonator swap gates surrounding one arbitrary qubit-resonator gate.

The qubit itself may be one of several types of superconducting devices, where some exemplary qubits include a transmon or a fluxonium. In both of these, the capacitance $C_\Sigma$ is shunted by a non-linear inductive component. In the case of the transmon, this is a single Josephson junction (see FIG. 3D), whereas for the fluxonium, it is a junction in parallel with a linear inductor (see FIG. 3E). In both cases, the circuit can be seen generally as a capacitance $C_\Sigma$ connected in parallel to a component with an energy $V(\hat{\phi})$ that depends only on the phase variable (see FIG. 3F).

Figure 3G:
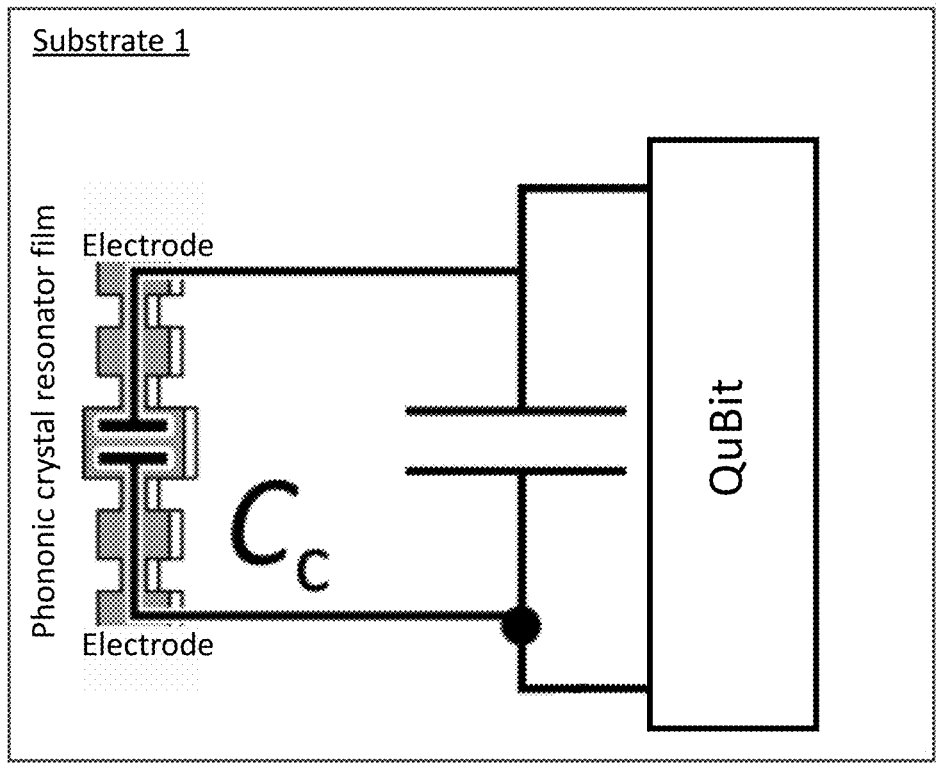
Figure 3H:
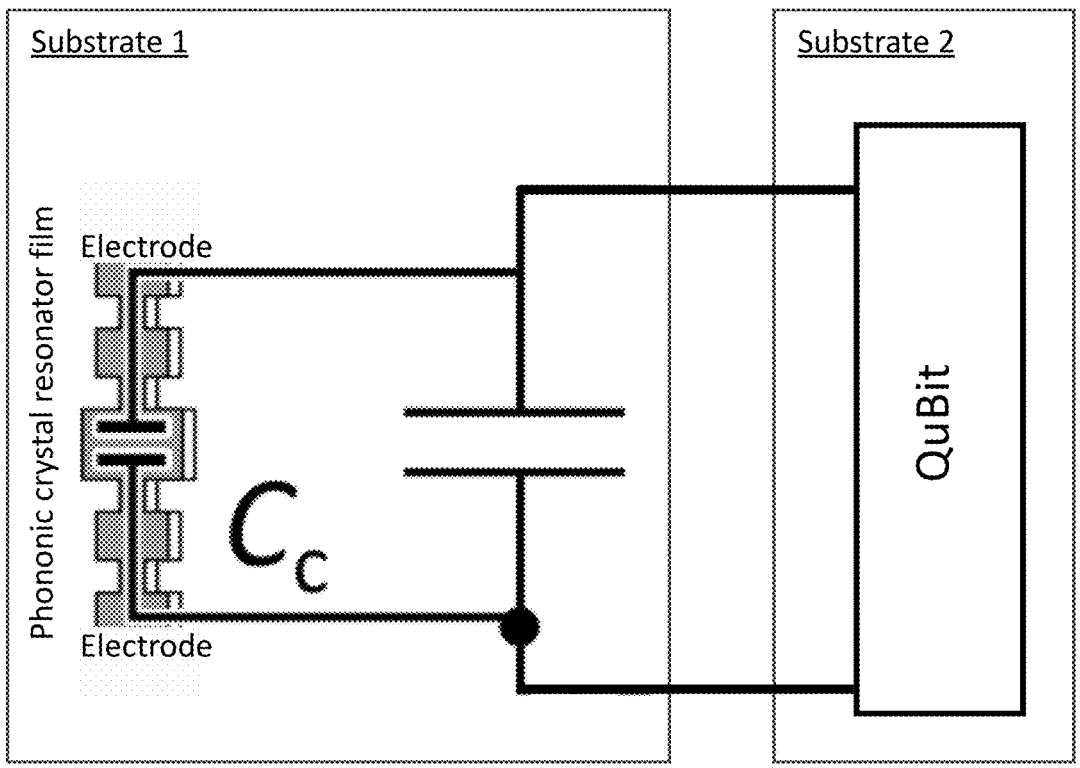

FIGS. 3G-3H show the qubit is disposed on the substrate, or disposed on a separate substrate, respectively.

The strength of the coupling between the qubit and the mechanical mode can be characterized by the matrix element $\langle g1|\hat{H}_{int}|e0\rangle$, where $|g1\rangle = |g\rangle \otimes |1\rangle$ is the tensor product of the qubit's ground state $|g\rangle$ with the phononic single-photon Fock state $|1\rangle$. Similarly, $|e0\rangle = |e\rangle \otimes |0\rangle$ is a combination of the qubit's first excited state $|e\rangle$ and the phononic vacuum state $|0\rangle$. The coupling strength parameter g is then given by $$g = \frac{2eq_{\mathit{eff}}}{\hbar C_\Sigma} \langle g|\hat{n}|e\rangle,$$

where $\hat{n}$ is the Cooper-pair number operator. As is shown herein, there is an upper limit on g which depends only on $C_\Sigma$ and the qubit frequency $\omega_0$, independently of the exact nature of the circuit's inductive part. This limit follows from the well-known Thomas-Reiche-Kuhn sum rule but we show its derivation here for completeness. Starting with the circuit's Hamiltonian $$\hat{H} = 4E_C\hat{n}^2 + V(\hat{\phi}),$$

where $E_C = e^2/2C_\Sigma$ is the charging energy of the qubit. It is then observed that due to the identity $\exp(iu\hat{\phi})\hat{n}\exp(-iu\hat{\phi})$ the ground state energy $E_0$ of the modified Hamiltonian $\hat{H}(u) = 4E_C(\hat{n}+u)^2 + V(\hat{\phi})$ does not depend on u. In particular, the second derivative of $E_0$ with respect to u at u=0 is then zero. Expressing this derivative using perturbation theory, provides $$8E_C - 2\sum_{i>0} \frac{|\langle\varphi_i|8E_C\hat{n}|\varphi_0\rangle|^2}{E_i - E_0} = 0,$$

where $|\varphi_i\rangle$ are the eigenstates of the circuit Hamiltonian $\hat{H}$ and $E_i$ their eigenenergies. Specifically, $|\varphi_0\rangle = |g\rangle$; $|\varphi_1\rangle = |e\rangle$ and $E_1 - E_0 = \hbar\omega_0$. All the terms in the sum are non-negative and therefore $$8E_C - 2\sum_{i>0} \frac{|\langle\varphi_i|8E_C\hat{n}|\varphi_0\rangle|^2}{E_i - E_0} = 0,$$

From here it follows that $$g \leq q_{\mathit{eff}}\sqrt{\frac{\omega_0}{2\hbar C_\Sigma}}.$$

The maximum is reached for a purely linear circuit, that is, one with $V(\hat{\phi})=E_L\hat{\phi}^2/2$. Considering the case where the circuit is a weakly non-linear transmon qubit which can closely approach the theoretical limit above. While it is possible for a strongly non-linear circuit with a lower $C_\Sigma$ to reach a stronger coupling than a transmon with a higher $C_\Sigma$, it will be seen that the required coupling is compatible with a weakly non-linear system and it is therefore sufficient to consider a transmon.

To achieve the optimal coupling rate given by Eq. (3), the capacitance of the qubit needs to be at most $$C_\Sigma = \frac{2q_{\mathit{eff}}^2}{\hbar\omega}\left(\frac{4AN^2\omega_0}{\pi(N\Gamma_r+3\Gamma_q/4)}\right)^{2/3}.$$

To estimate the parameter $q_{\mathit{eff}}$, considering the coupling geometry shown in FIG. 3A. There the total capacitance of the simulated circuit was $C_\Sigma=200$ fF and the calculated coupling roughly $g/2\pi=10$ MHz at a frequency $\omega_0/2\pi=2$ GHz. As the weakly non-linear circuit effectively reaches the upper bound on g derived above, one can calculate $q_{\mathit{eff}}=\sqrt{2hC\Sigma g^2/\omega_0}=4\times10^{-21}$ C. It is expected that this number could be made higher by further optimization of the coupler geometry and it can certainly be made smaller if desired, so this value is a conservative upper bound on $g_{\mathit{eff}}$.

In practice, we cannot make $C_\Sigma$ arbitrarily low, mainly due to the two following constraints: Each of the N qubit-resonator couplers has an associated capacitance $C_1$ and $C_\Sigma$ therefore has to be at least $NC_1$. Finite element simulations indicate that for the coupler design shown in FIG. 3A, $C_1$ is on the order of 1fF. Furthermore, $C_\Sigma$ needs to be high enough to bring the qubit into the transmon regime where $E_J \gg E_C$. Since $2E_J/E_C=(\hbar\omega_0 C_\Sigma/e^2)^2$, the minimal $C_\Sigma$ required to achieve $E_J/E_C \gg 1$ is approximately $C_\Sigma=4e^2/\hbar\omega_0$. Assuming $\omega_0/2\pi=4$ GHz, this equals approximately 40 fF.

Figure 3I:
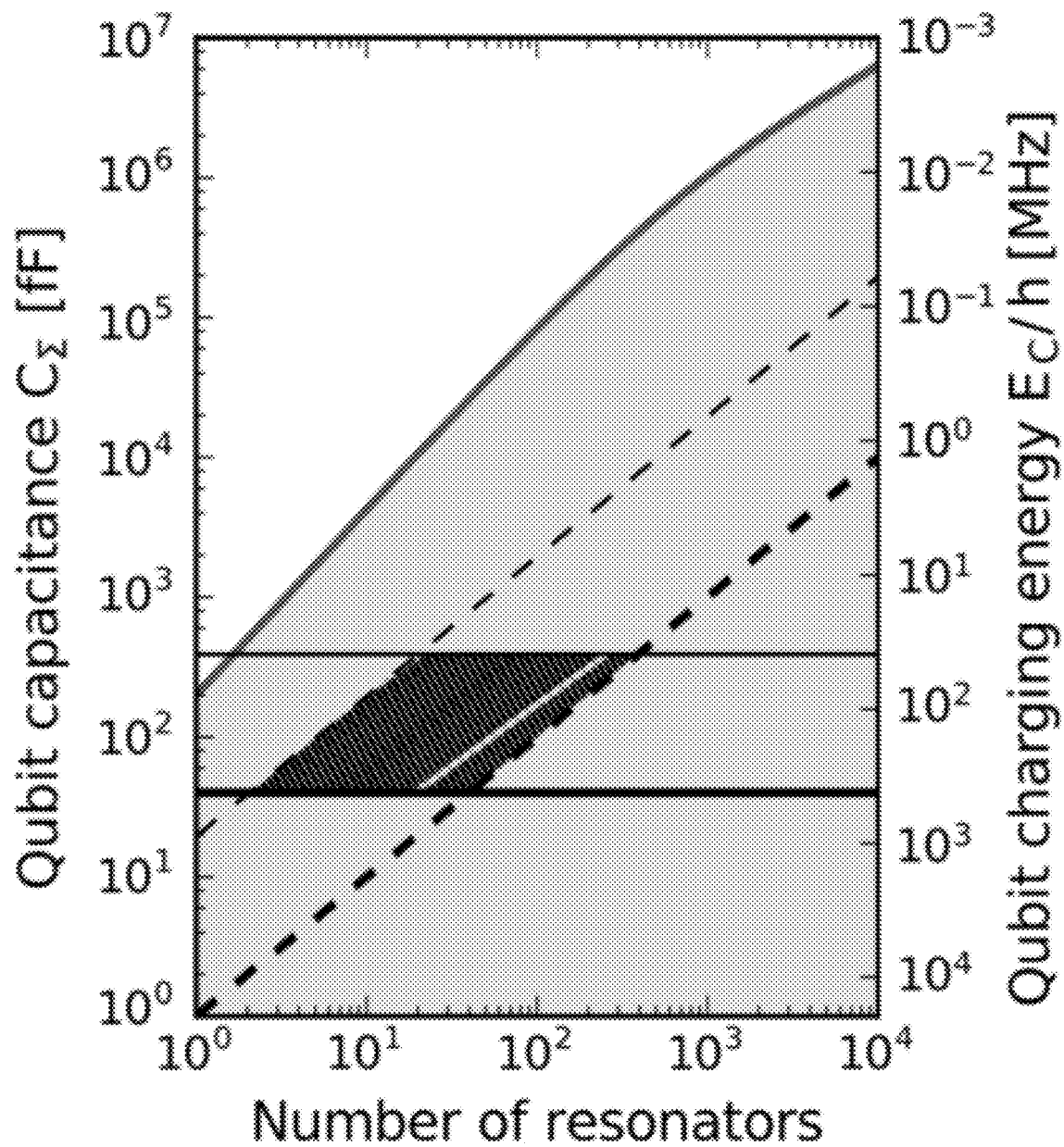

The maximum capacitance $C_\Sigma$ consistent with the optimal coupling g is plotted in FIG. 3I and observe that even for low numbers of resonators, it lies above the two aforementioned lower limits.

Finally, the transmon circuit also needs to have a sufficiently large anharmonicity to be useful as a qubit and to satisfy the assumption made when deriving the cross-talk error estimate above. Namely that the spurious transition to the second excited state can be kept detuned by at least half of the nearest-neighbor detuning between the resonators $\omega_0/2N$. As the anharmonicity in a weakly nonlinear circuit is approximately given by the charging energy $E_C=e^2/2C_\Sigma$, this gives upper limits on $C_\Sigma$ which are shown by the thin solid and dashed lines in FIG. 3I.

The three upper limits (one set by the necessary coupling g, the other two by the minimal anharmonicity) and two lower limits (due to the transmon condition and the capacitance of the couplers) define the shaded region in FIG. 3I which extends all the way to approximately N=200. Hence, even taking the practical constraints discussed here into account, it is expected that the optimal coupling given by Eq. (3) can be achieved in devices with a significant number of storage modes.

Disclosed herein is a hybrid quantum information processing architecture which combines a superconducting qubit acting as a processor and multiple nanomechanical resonators based on phononic crystal cavities for information storage, coupled directly to the qubit. The phononic crystal resonators are uniquely suited to make the storage modes both very long lived and compact. This, together with the fact that only the processing qubit needs to be externally controlled, is beneficial for scaling.

The trade-off between two major sources of error were carefully analyzed in such a system—gate cross-talk and decoherence—and found an optimal value for the qubit-resonator coupling which minimizes the estimated error. The calculated optimal coupling can be reached even if practical constraints on the system are taken into account, was shown. To analyze the performance of the current system in quantum computing applications, its quantum volume was estimated and found it to be around 220. That is, a system of this kind with approximately 15 stored qubits could run a quantum circuit with a depth of 15 before the error probabilities become significant. For comparison, an analogous system using on-chip microwave resonators for information storage was also analyzed and found that its quantum volume is smaller by about a factor of 3 due to the lower quality factors of the resonators.

The results derived were emphasized here for the electromechanical system apply equally to any other implementation where the storage modes are significantly longer-lived than the qubit. For instance, storage in high-quality 3d microwave cavities could in principle achieve the same performance. However, thanks to the very small size of the mechanical resonators, the current invention does not suffer from the scaling difficulties which may arise in a system with a large number of 3d cavities.

Finally, it is noted that though this electromechanical platform was analyzed mainly in the context of quantum information processing, one can expect such long-lived compact quantum memories to find applications in quantum repeater systems. In this context where storage is the primary purpose of the device and not merely a necessity enforced by the sequential gate execution, using mechanical modes with a high quality factor achieves a true advantage over on-chip microwave circuits. In the simplest quantum repeater schemes operating without error correction, the memory needs to hold information for an extended period of time until entangled qubit pairs are successfully distributed over all sections of the long quantum link. Due to transmission losses, the entanglement distribution scheme is non-deterministic and needs to be heralded. For long distances, the average time until success may be significantly longer than the propagation time over the whole link, necessitating very high-quality quantum memories.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. Apparatus comprising:
   a) a phononic crystal resonator film disposed on a substrate;
   wherein said phononic crystal resonator film comprises two or more one-dimensional phononic crystal mechanical resonators having two or more corresponding distinct resonance frequencies to provide two or more storage qubits that are individually addressable by frequency, wherein direct phononic coupling between the mechanical resonators is negligible;

b) a pair of electrodes disposed to generate voltages within said phononic crystal resonator film;

c) a coupling capacitor that is coupled to said phononic crystal resonator film via said pair of electrodes; and d) a processing qubit, wherein said processing qubit is capacitively coupled to said phononic crystal resonator film by said coupling capacitor, whereby said two or more storage qubits are connected to said processing qubit.

2. The apparatus of claim 1, wherein said processing qubit is disposed on said substrate, or disposed on a separate substrate.

3. The apparatus of claim 1, wherein said distinct resonance frequencies are separated in frequency according to defect dimensions in each of the two or more one-dimensional phononic crystal mechanical resonators.

4. The apparatus of claim 1, wherein said phononic crystal resonator film comprises a piezoelectric crystal resonator film, wherein said piezoelectric crystal resonator film comprises a material selected from the group consisting of: lithium niobate, lithium tantalate, barium titanate, aluminum nitride, gallium arsenide, gallium nitride, gallium phosphide, and indium phosphide.

5. The apparatus of claim 1, wherein said substrate comprises a material selected from the group consisting of: silicon and sapphire.

6. The apparatus of claim 1, wherein said apparatus is configured for gate execution.

7. The apparatus of claim 1, wherein said piezoelectric crystal resonator film is incorporated to a circuit configuration selected from the group consisting of:
   a) a processing Josephson-junction-based qubit,
   b) a fluxonium circuit,
   c) a transmon qubit,
   d) a (Superconducting Nonlinear Asymmetric Inductive eLements) SNAIL qubit,
   e) a quantum circuit acting on N mechanical modes acting as storage qubits, and
   f) a circuit where any two-qubit gates between distinct pairs of said storage qubits are performed simultaneously.

8. The apparatus of claim 7, wherein a flip-chip bond is disposed to connect said processing qubit to said phononic crystal resonator film, wherein coupling between said phononic crystal resonator film and said storage qubits comprises via-coupling, or parametric coupling, wherein said storage qubits provide a storage mode encoding comprising a discrete variable encoding or a continuous variable encoding.

9. The apparatus of claim 1, wherein the storage qubits comprise two qubit-resonator swap gates surrounding said processing qubit, wherein the processing qubit also acts as a gate.

10. The apparatus of claim 1, wherein said apparatus is a superconducting circuit.

* * * * *